United States Patent
Ker et al.

(10) Patent No.: US 7,582,916 B2
(45) Date of Patent: Sep. 1, 2009

(54) SILICON CONTROLLED RECTIFIER

(75) Inventors: MIng-Dou Ker, Hsinchu County (TW);
Chun-Yu Lin, Hualien County (TW);
Chang-Tzu Wang, Taipei (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 12/013,637

(22) Filed: Jan. 14, 2008

(65) Prior Publication Data

US 2009/0179222 A1    Jul. 16, 2009

(51) Int. Cl.
*H01L 29/72* (2006.01)
(52) U.S. Cl. .................. 257/107; 257/170; 257/173; 257/618
(58) Field of Classification Search ............... 257/107, 257/170, 173, 618
See application file for complete search history.

(56) References Cited

U.S. PATENT DOCUMENTS

| 4,896,243 | A | 1/1990 | Chatterjee et al. |
| 4,939,616 | A | 7/1990 | Rountree |
| 6,137,143 | A | 10/2000 | Dabral et al. |
| 6,410,965 | B1* | 6/2002 | Yu .......................... 257/356 |
| 7,012,304 | B1 | 3/2006 | Dabral et al. |

* cited by examiner

*Primary Examiner*—Edward Wojciechowicz
(74) *Attorney, Agent, or Firm*—J.C. Patents

(57) ABSTRACT

A silicon controlled rectifier structure of polygonal layouts is provided. The polygonal first conductive type doped region is located in the middle of the polygonal second conductive type well. The first conductive type well shaped as a polygonal ring surrounds the second conductive type well and the second conductive type doped region is located within the first conductive type well and shaped as a polygonal ring concentric to the first conductive type well.

16 Claims, 3 Drawing Sheets

SILICON CONTROLLED RECTIFIER

BACKGROUND OF THE INVENTION

1. Field of the Invention

This invention generally relates to a semiconductor device, and more particularly to a silicon controlled rectifier (SCR) for electrostatic discharge (ESD) protection.

2. Description of Related Art

As high-amplitude electrostatic discharge (ESD) pulses are an inevitable part of the daily environments, semiconductor devices are unquestionably susceptible to damages by ESD. Due to the possible occurrence of ESD during the normal lifetime of the devices, it is important that the design of the devices should provide a reasonable and acceptable level of tolerance to ESD. Typically, an additional protection structure or circuit is designed to provide a discharge path for the additional current caused during ESD, thus preventing damage to the device or the IC. ESD protection circuits or devices are usually located between the input/output (I/O) pads (or pins) and ground (or power rail). Moreover, ESD protection circuits can be incorporated into the MOS circuits on the chip.

The silicon controlled rectifier (SCR) devices have been proposed to serve as the ESD protection device due to its relatively high ESD level and small layout area. The SCR device is made up of four semiconductor layers arranged as P–N–P–N and can be considered as one PNP transistor and one NPN transistor working together. As an ESD stress having a voltage higher than the triggered point (or the turn-on voltage) is applied to the anode, the SCR device becomes conductive and permits the majority of the ESD current to bypass, thus enhancing the ESD tolerance of the circuits.

However, for the on-chip design, the parasitic capacitance of the ESD protection circuit may cause performance degradation to the core circuits of the chip. Therefore, the ESD protection circuits should be designed to minimize the parasitic capacitance for least negative impact and to sustain high enough ESD robustness for protection.

SUMMARY OF THE INVENTION

The present invention provides a SCR (silicon controlled rectifier) structure, which can ensure adequate ESD protection without compromising performance of the circuits. The design of the SCR device in the present invention can reduce the device size under the same level of ESD robustness and decrease the parasitic capacitance of the device.

The present invention provides a silicon controlled rectifier (SCR) structure comprising a substrate with at least a first conductive type well and a second conductive type well, a first conductive type doped region located in the second conductive type well and a second conductive type doped region located in the first conductive type well. The first conductive type can be P-type, while the second conductive type can be N-type, for example. Alternatively, the first conductive type can be N-type, while the second conductive type can be P-type.

In one embodiment of the present invention, according to the layout of the SCR structure, the second conductive type well and the first conductive type doped region located in the second conductive type well are shaped as equiformal polygons (polygons of the same shape but in different sizes), and the first conductive type well and the second conductive type doped region are shaped as concentric polygonal rings.

In one embodiment of the present invention, the SCR structure includes the square N-well, the square P-type doped region located in the middle of the N-well and square ring-shaped P-well and N-type doped region concentrically encircling the N-well. In another embodiment of the present invention, the SCR structure further includes a heavily doped region located between the N-well and the P-well.

In an embodiment of the present invention, the SCR structure includes the octagonal N-well, the octagonal P-type doped region located in the middle of the N-well and concentric, octagonal ring-shaped P-well and N-type doped region encircling the N-well. In another embodiment of the present invention, the SCR structure further includes a heavily doped region located between the N-well and the P-well.

The SCR structure according to the embodiments of the present invention affords better ESD discharge capacity with improved current spreading. Due to the polygonal layout design, the SCR structure, functioning as the ESD protection device, provides smaller device sizes under the same ESD robustness. Furthermore, the parasitic capacitance of the ESD protection device can be effectively reduced with smaller device sizes. The structure of the present invention may be suitably applied for on-chip ESD protection for the I/O pins of general-purpose circuits or for high-speed applications.

In addition, the structure described in the embodiments can be concurrently fabricated or formed by the same steps of the CMOS processes. Such CMOS process-compatible SCR structure may be suitably used as on-chip ESD protection devices for GHz radio-frequency (RF) circuits.

One or part or all of these and other features and advantages of the present invention will become readily apparent to those skilled in this art from the following description wherein there is shown and described a preferred embodiment of this invention, simply by way of illustration of one of the modes best suited to carry out the invention. As it will be realized, the invention is capable of different embodiments, and its several details are capable of modifications in various, obvious aspects all without departing from the invention. Accordingly, the drawings and descriptions will be regarded as illustrative in nature and not as restrictive.

DESCRIPTION OF THE PREFERRED EMBODIMENTS

The present invention discloses a silicon controlled rectifier (SCR) structure serving as an ESD protection device. In the following embodiments, the SCR structure can be incorporated or embedded into the MOS or CMOS circuits and the manufacture of the SCR structure is compatible with the CMOS processes. The embodiments described below are for the demonstration of the present invention, and do not intend to limit to the scope of the present invention.

Figure 1:
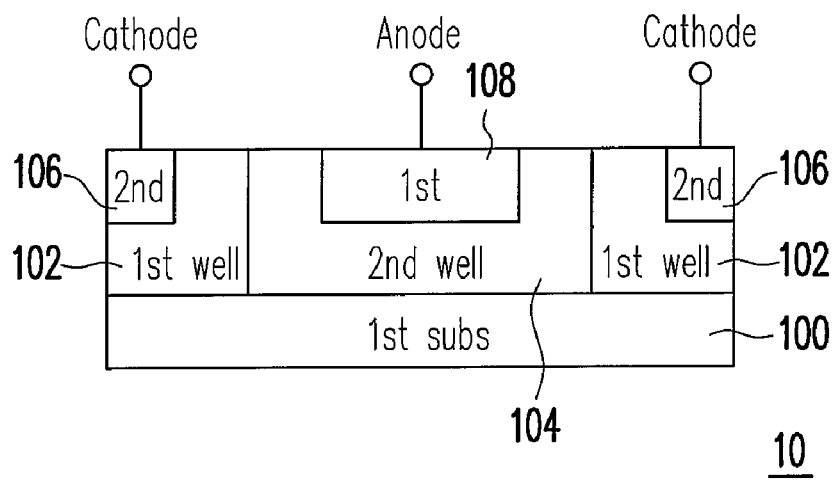
FIG. 1 shows a cross-sectional view of a SCR structure according to one preferred embodiment of this invention.
Figure 2:
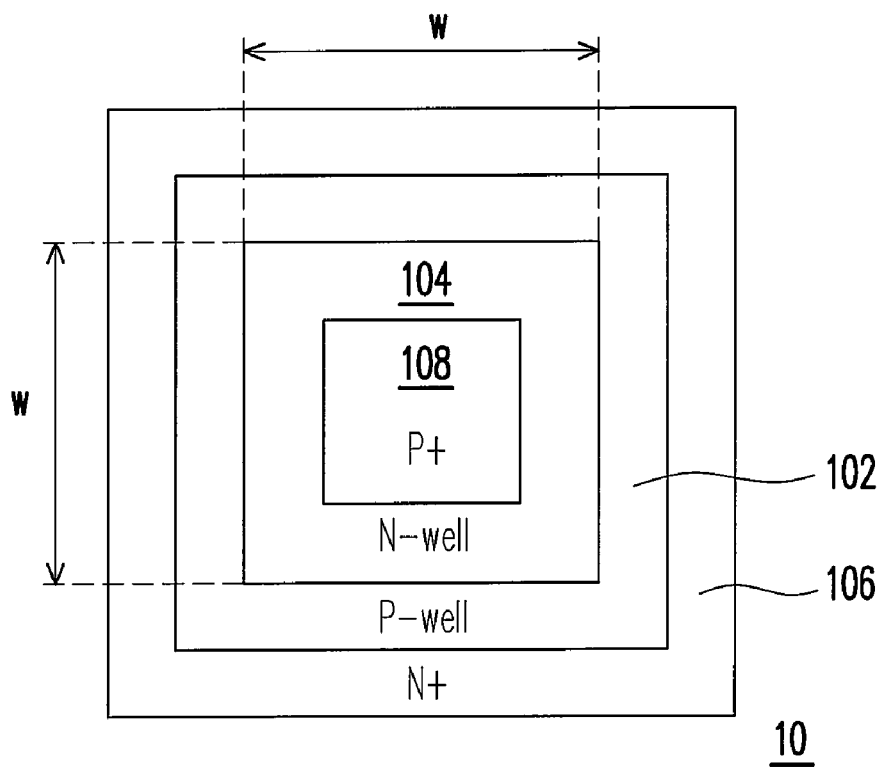
FIG. 2 shows an example of a top view of the SCR structure according to one preferred embodiment of this invention.

FIG. 1 shows a cross-sectional view of a SCR structure according to one preferred embodiment of this invention. FIG. 2 shows an example of a top view of the SCR structure according to one preferred embodiment of this invention. In FIG. 1, the SCR structure 10 includes a first conductive type substrate 100 with at least a first conductive type well 102 and at least a second conductive type well 104 formed therein. The first conductive type well 102 surrounds the second conductive type well 104 and is adjoined with the second conductive type well 104. One first conductive type doped region 108 is formed within and in the middle of the second conductive type well 104, while one second conductive type doped region 106 is formed within and located on an outer portion the first conductive type well 102. According to the present invention, the first conductive type can be P-type and the second conductive type can be N-type, for example. Accordingly, the second conductive type doped region 106 is a heavily doped N+ region, while the first conductive type doped region 108 is a heavily doped P+ region, for example. Alternatively, the first conductive type can be N-type and the second conductive type can be P-type.

Taking the structure of FIG. 2 as an example, the first conductive type is P-type and the second conductive type is N-type. As shown in FIG. 2, the P-type doped region 108 is formed as a square and located in the middle of the N-type well (N-well) 104, and the N-well 104 surrounds the P-type doped region 108. The P-type well (P-well) 102 surrounds the N-well 104, while the N-doped region 106 encircles the P-well 102. From the top view layout of FIG. 2, the SCR structure 10 includes the square-shaped N-well 104, the square-shaped P-type doped region 108 located in the middle of the N-well 104 and square ring-shaped P-well 102 and N-type doped region 106 concentrically encircling the N-well 104. The top view of the SCR structure looks alike the dart board or target in a square shape. That is, the N-well 104 and the P-type doped region 108 are of the same shape (i.e. square), while the P-well 102 and the N-type doped region 106 are concentric rings of the identical square shape.

For the fabrication of the SCR structure being compatible with the CMOS processes, N-well 104 and P-well 102 can be formed respectively from the steps of forming the N-well for PMOS (i.e. N-well mask) and forming P-well for NMOS (i.e. P-well mask) in the integrated circuit. Similarly, the N-type doped region 106 can be formed during forming the source/drain of NMOS, while P-type doped region 108 can be formed during forming the source/drain of PMOS.

The first conductive type doped region 108 in the second conductive type well 104 is electrically connected to the anode of the device through vias, and the second conductive type doped region 106 is electrically connected to the cathode of the device through vias. The second conductive type doped region 106 in the first conductive type well 102 is electrically connected to the cathode (usually grounded). Given that the first conductive type is P-type and the second conductive type is N-type as shown in FIG. 2, the SCR structure 10 can be considered to include the equivalent PNP transistor having an emitter (P-type doped region 108), a base (N-well 104) and a collector (P-well 102) in conjunction with the equivalent NPN transistor having a collector (N-well 104), a base (P-well 102) and an emitter (N-type doped region 106). On the other hand, if the first conductive type is N-type and the second conductive type is P-type, the SCR structure can be considered to include NPNP junctions of the equivalent NPN transistor and the equivalent PNP transistor.

When the anode is zapped by ESD stresses, the high voltage of the ESD causes the base-collector junction breakdown, and the PNP and NPN transistors are turned on by the large bias current. Hence, the ESD currents can be quickly discharged by the SCR device. The SCR structure described above can discharge ESD currents evenly in four directions due to its square layout. Not only the ESD protection device with the above layout structure can uniformly discharge the ESD currents, but also the compact layout of the SCR structure affords smaller device sizes under the same ESD robustness. Furthermore, the parasitic capacitance of the ESD protection device can be effectively reduced with smaller device sizes.

Figure 3:
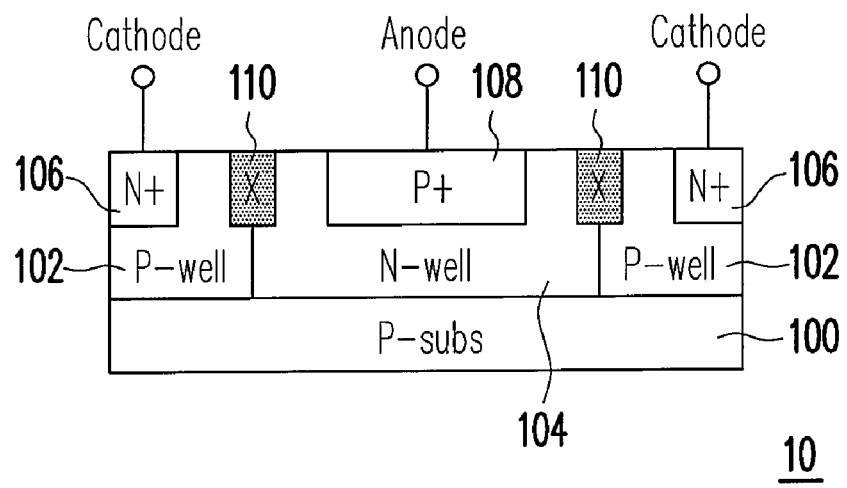
FIG. 3 shows a cross-sectional view of a SCR structure according to another preferred embodiment of this invention.
Figure 4:
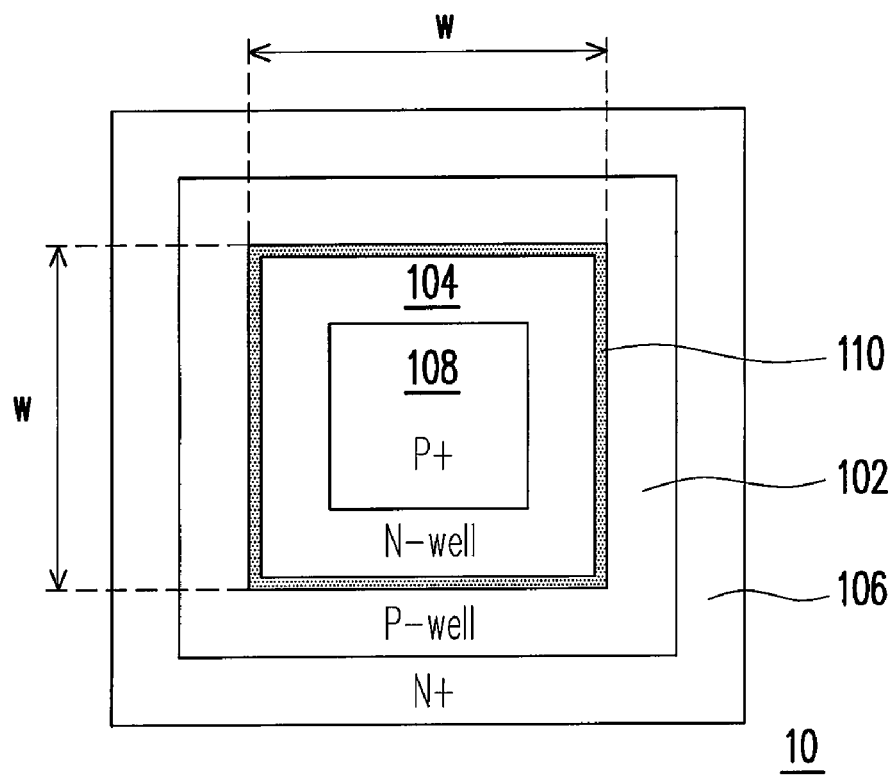
FIG. 4 shows an example of a top view of the SCR structure according to another preferred embodiment of this invention.

Alternatively, the SCR structure can be further modified if a lower turn-on voltage is desired. FIG. 3 shows a cross-sectional view of a SCR structure according to another preferred embodiment of this invention. FIG. 4 shows an example of a top view of the SCR structure according to another preferred embodiment of this invention. As shown in FIGS. 3 and 4, the SCR structure 10 is similar to the structure shown in FIG. 1 and 2, except that a heavily doped region 110 is formed along the border between the N-well 104 and P-well 102. From the top view, the shape of the heavily doped region 110 is a square ring. The heavily doped region 110 can be a heavily doped N+ or P+ region, for example. By forming the heavily doped region 110, the SCR structure has a lower breakdown voltage of the reverse-biased base-collector junction, so that the ESD protection device can be turned-on by a lower voltage. This modified SCR structure provides better turn-on efficiencies and better ESD protection due to the lower breakdown voltage.

Figure 5:
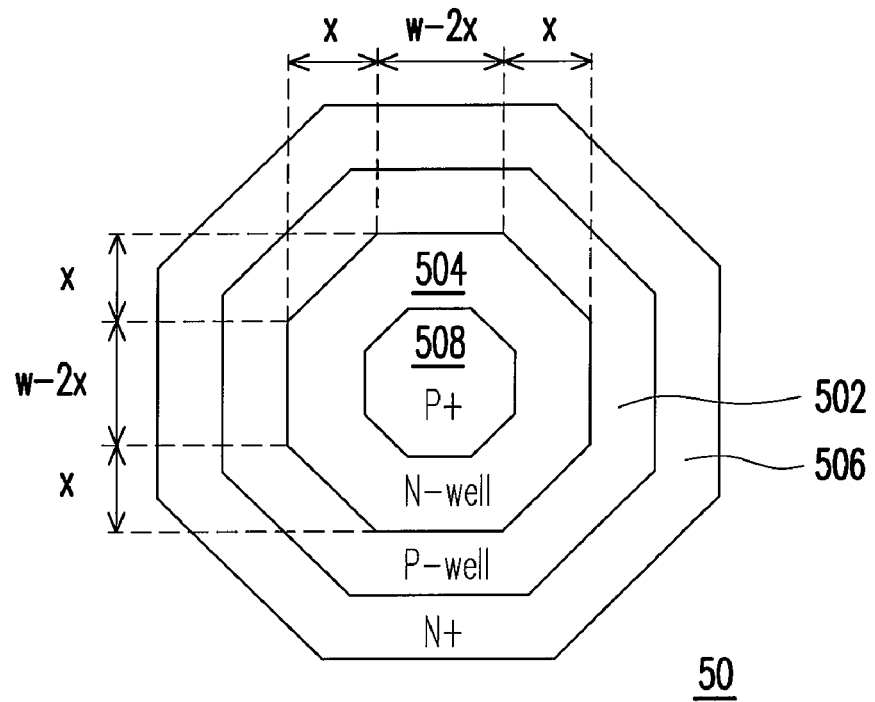
FIG. 5 shows an example of a top view of the SCR structure according to a different preferred embodiment of this invention.

The design of the SCR structure can be further modified in order to minimize the parasitic capacitance of the ESD protection device. FIG. 5 shows an example of a top view of the SCR structure according to a different preferred embodiment of this invention. The cross-sectional view of FIG. 5 is similar to the structure shown in FIG. 1, and will not be described herein in details. In FIG. 5, the P-type doped region 508 is formed as an octagon and located in the middle of the N-well 504, and the octagonal N-well 504 surrounds the P-type doped region 508. The P-well 502 surrounds the N-well 504, while the N-doped region 506 encircles the P-well 502. From the top view layout of FIG. 5, the SCR structure 50 includes the octagonal N-well 504, the octagonal P-type doped region 508 located in the middle of the N-well 504 and concentric, octagonal ring-shaped P-well 502 and N-type doped region 506 encircling the N-well 504. The top view of the SCR structure looks like the octagonal dart board. That is, the N-well 504 and the P-type doped region 508 are of the same shape (i.e. octagonal), while the P-well 502 and the N-type doped region 506 are shaped as concentric octagonal rings.

The ESD protection device with the octagonal layout structure can further improve the current spreading, as the ESD currents can be uniformly discharged in eight directions. Moreover, the octagonal SCR structure further shrink down the device size and reduce the parasitic capacitance.

Figure 6:
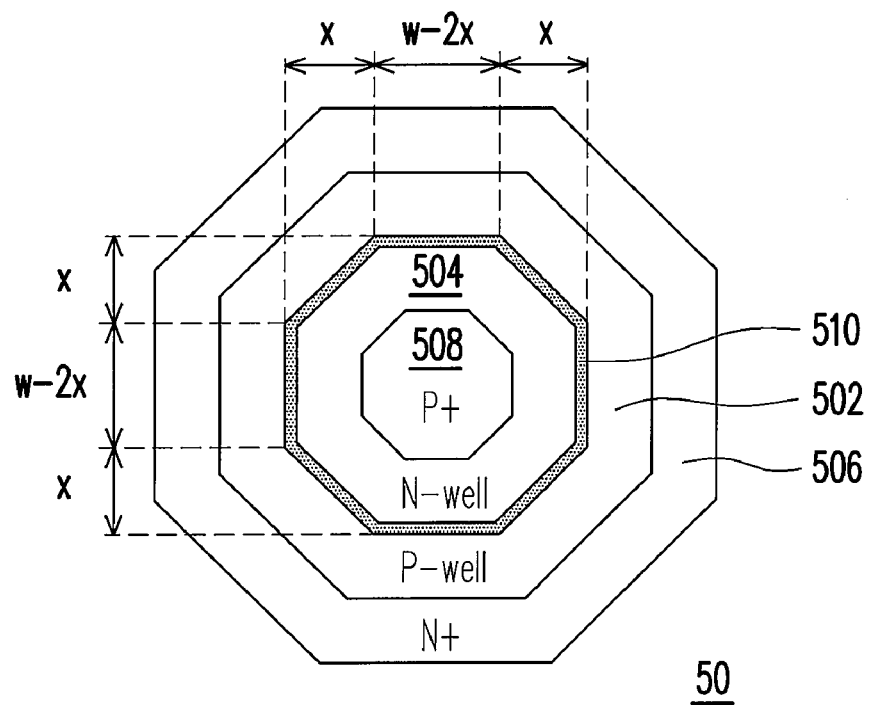
FIG. 6 shows an example of a top view of the SCR structure according to another different preferred embodiment of this invention.

Furthermore, as shown in FIG. 6, for the SCR structure 50, a heavily doped region 510 can be formed along the border between the N-well 504 and P-well 502, if a lower turn-on voltage is desired. From the top view, the shape of the heavily doped region 510 is an octagonal ring. The heavily doped region 510 can be a heavily doped N+ or P+ region, for example.

The manufacturing processes for forming the afore-mentioned SCR structures are in general compatible with the processes of CMOS technology, but extra process steps or parameter modifications can be further applied depending on the layout requirements.

The performance of the proposed SCR structure can be calculated from the following equations. The parasitic capacitance of the SCR device is given by:

$$\text{Parasitic Capacitance} = C_j \cdot \text{Area}_{N\text{-well}} + C_{jsw} \cdot \text{Perimeter}_{N\text{-well}} \quad (1)$$

where $C_j$ is the capacitance of the junction between N-well and P-substrate, $C_{jsw}$ is the capacitance of the junction of N-well and P-well, and Perimeter $_{N\text{-well}}$ is the perimeter of N-well.

The ESD robustness of the SCR device is proportional to the perimeter of the N-well. As the corners of the N-well act as discharge points, the ESD currents may be uniformly discharged as long as the shape of the N-well provides more corners. The ESD robustness of the SCR device can be expressed as:

$$\text{ESD Robustness} \propto \text{Perimeter}_{N\text{-well}} \cdot (\text{Corner}_{N\text{-well}})^\alpha \quad (2)$$

where Corner $_{N\text{-well}}$ is the corner numbers of N-well, and $\alpha$ is the positive coefficient of the process. Thus, the ratio of the parasitic capacitance to the ESD robustness of the SCR device is:

$$\frac{\text{Parasitic Capacitance}}{\text{ESD Robustness}} = \frac{C_j \cdot \frac{\text{Area}_{n\text{-well}}}{\text{Perimeter}_{n\text{-well}}} + C_{jsw}}{(\text{Corner}_{n\text{-well}})^\alpha} \quad (3)$$

If considering the perimeter of the N-well being 4W, the ratio of the parasitic capacitance to the ESD robustness of the square SCR structure in FIG. 2 is:

$$\frac{\text{Parasitic Capacitance}}{\text{ESD Robustness}} = \frac{C_j \cdot \frac{W^2}{4W} + C_{jsw}}{4^\alpha} = \frac{C_j \cdot \frac{W}{4} + C_{jsw}}{4^\alpha} \quad (4)$$

If considering the perimeter of the N-well being $8(W-2X)$ and the area of the N-well being $W^2-2X^2$, the ratio of the parasitic capacitance to the ESD robustness of the octagonal SCR structure as shown in FIG. 5 is:

$$\frac{\text{Parasitic Capacitance}}{\text{ESD Robustness}} = \frac{C_j \cdot \frac{W^2 - 2X^2}{8(W - 2X)} + C_{jsw}}{8^\alpha} \quad (5)$$

To simplify the calculation of Equation (5), if considering the octagonal SCR structure as an equilateral octagon, the ratio of the parasitic capacitance to the ESD robustness is:

$$\frac{\text{Parasitic Capacitance}}{\text{ESD Robustness}} = \frac{C_j \cdot \frac{2(\sqrt{2} - 1)W^2}{8(\sqrt{2} - 1)W} + C_{jsw}}{8^\alpha} \quad (6)$$

$$= \frac{C_j \cdot \frac{W}{4} + C_{jsw}}{8^\alpha}$$

Comparing Equation (4) and Equation (6), it is found that the octagonal SCR structure has the lower ratio of the parasitic capacitance to the ESD robustness than the square SCR structure.

The proposed SCR structures of the preferred embodiment can discharge ESD currents in multiple directions and greatly improve the discharge capacity due to current spreading. According to the previous embodiments, the layout of the SCR structure can be designed as a polygonal P-type doped region, located in a polygonal N-well and surrounded by concentric polygonal ring-shaped P-well and N-type doped region. The polygonal shape can be tetragonal, hexagonal, octagonal, dodecagonal or dioctagonal, for example. Moreover, under the photolithographic corrections or other treatments, the shape of the SCR layout structure may even be round or circular. Preferably, the polygons may be equiangular, equilateral or regular polygons, for example. Due to the polygonal design as described in the embodiments, such compact SCR structures occupy much less area and thus reduce the parasitic capacitances without compromising the ESD robustness.

For high speed input/output (I/O) ports and radio frequency circuits, the parasitic capacitance of the ESD protection device would seriously degrade the circuit performance. In this case, the proposed SCR devices are suitably used as ESD protection devices for high speed I/O ports and/or radio frequency circuits.

The foregoing description of the preferred embodiment of the present invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A silicon controlled rectifier structure, comprising:
a p-type substrate having at least an N-well and a P-well therein, wherein a doping concentration of the P-well is higher than a doping concentration of the p-type substrate, and the P-well surrounds and adjoins with the N-well;
a P-type doped region located within the N-well and in the middle of the N-well; and
an N-type doped region located within the P-well, wherein the N-type doped region is located along an outward edge of the P-well and separated from the N-well.

2. The structure of claim 1, wherein the P-type doped region and the N-well are shaped as equiformal polygonal regions, while the P-well and the N-type doped region are shaped as polygonal ring regions concentrically to the polygonal regions.

3. The structure of claim 2, wherein the polygonal regions are square and the polygonal ring regions are square.

4. The structure of claim 2, wherein the polygonal regions are hexagonal and the polygonal ring regions are hexagonal.

5. The structure of claim 2, wherein the polygonal regions are octagonal and the polygonal ring regions are octagonal.

6. The structure of claim 1, further comprising a heavily doped region located on a border between the N-well and the P-well.

7. The structure of claim 6, wherein the heavily doped region is a heavily doped N+ region.

8. The structure of claim 6, wherein the heavily doped region is a heavily doped P+ region.

9. A silicon controlled rectifier structure, comprising:

a first conductive type substrate having at least a first conductive type well and a second conductive type well therein, wherein a doping concentration of the first conductive type well is higher than a doping concentration of the first conductive type substrate, and the first conductive type well surrounds and adjoins with the second conductive type well;

a first conductive type doped region located within the second conductive type well and in the middle of the second conductive type well; and a second conductive type doped region located within the first conductive type well, wherein the second conductive type doped region is located along an outward edge of the first conductive type well and separated from the second conductive type well.

10. The structure of claim 9, wherein the first conductive type doped region and the second conductive type well are shaped as equiformal polygonal regions, while the first conductive type well and the second conductive type doped region are shaped as polygonal ring regions concentric to the polygonal regions.

11. The structure of claim 10, wherein the polygonal regions are square and the polygonal ring regions are square.

12. The structure of claim 10, wherein the polygonal regions are hexagonal and the polygonal ring regions are hexagonal.

13. The structure of claim 10, wherein the polygonal regions are octagonal and the polygonal ring regions are octagonal.

14. The structure of claim 9, wherein the first conductive type is P-type and the second conductive type is N-type.

15. The structure of claim 9, wherein the first conductive type is N-type and the second conductive type is P-type.

16. The structure of claim 9, further comprising a heavily doped region located on a border between the first conductive type well and the second conductive type well.

\* \* \* \* \*